United States Patent [19]

Pierce et al.

[11] 4,161,017
[45] Jul. 10, 1979

[54] METHOD AND APPARATUS FOR MOUNTING PRINTED CIRCUIT BOARDS

[75] Inventors: Perry H. Pierce; Dan L. Prendergast, both of Loveland, Colo.

[73] Assignee: Hewlett-Packard Company, Palo Alto, Calif.

[21] Appl. No.: 822,860

[22] Filed: Aug. 8, 1977

Related U.S. Application Data

[62] Division of Ser. No. 622,792, Oct. 15, 1975.

[51] Int. Cl.² .............................................. H02B 1/02
[52] U.S. Cl. .................................... 361/412; 16/171; 211/150; 361/399
[58] Field of Search .......................... 16/171, 173, 135; 361/399, 412, 415; 211/40, 41, 194, 188, 169, 149, 150, 170, 171, 173; 46/27-29; 40/104.12, 104.17, 97

[56] References Cited
U.S. PATENT DOCUMENTS 4,022,398   1/1977   Hanisch ............................ 361/426

*Primary Examiner*—David Smith, Jr.
*Attorney, Agent, or Firm*—David A. Boone

[57] ABSTRACT

Interlocking hinges are attached to printed circuit boards and coupled together to form a stack of printed circuit boards. Access to each board is possible by rotating the stack at a selected hinge to expose a selected board. A projection and an opening on each hinge mate with openings and projections on other hinges to allow easy removal or addition of a board from the stack when the hinges are in one relative position, but to create an interference fit in a second relative position, thereby causing the hinges to lock together and form a rigid structure.

6 Claims, 9 Drawing Figures

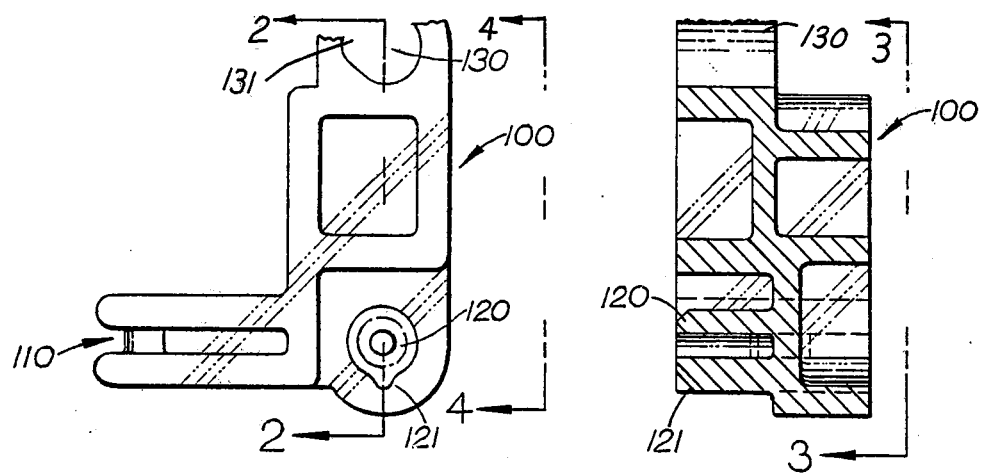
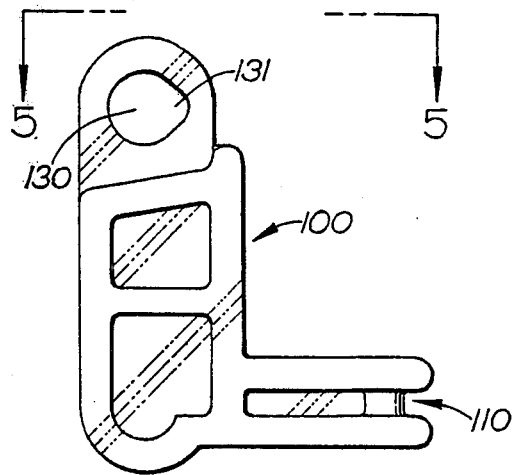
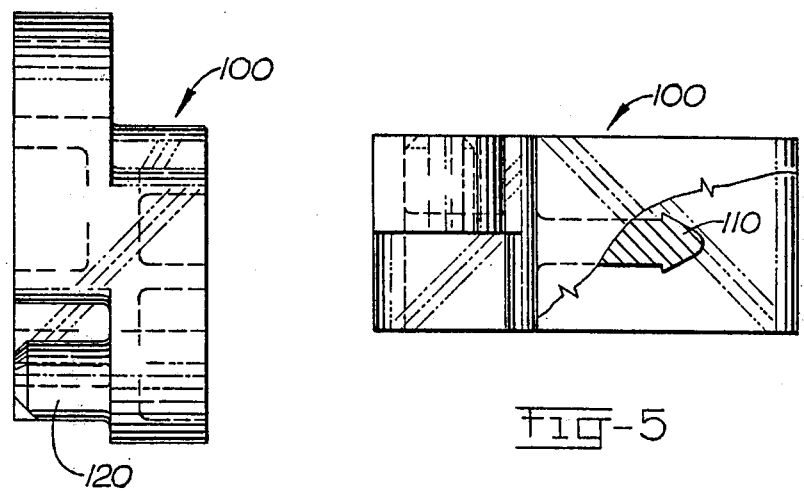

METHOD AND APPARATUS FOR MOUNTING PRINTED CIRCUIT BOARDS

This is a division of application Ser. No. 622,792, filed Oct. 15, 1975.

BACKGROUND & SUMMARY OF THE INVENTION

Printed circuit boards are widely used to contain the electronic circuits of various products. Access to the components of these circuits for testing and repair while the printed circuit boards are installed in the product has presented a problem. Although it is possible to use automatic testing fixtures to analyze boards while they are not in the instrument, some problems are most easily ascertained while the board is in position in the product and in its normal operating mode. Also, when the unit malfunctions at a customer's site, service personnel cannot always rely on testing equipment as sophisticated as that available at manufacturing facilities.

Some previous printed circuit board mounting methods have employed rigid structures which provided limited access. They required the use of extender boards and extension cables to provide access to components on a selected board. These techniques frequently distort or interfere with the operation of the board which has been extended from its normal position.

Hinged stand-offs have been used to mount printed circuit boards to each other or a supporting structure. This type of system had the disadvantage that misalignment of the hinged stand-offs coupling a board to a supporting structure interfered with the proper operation of the hinges. Also, the removal of a board from a structure employing hinged stand-offs requires removing hardware coupling the board to be removed from other boards or the supporting structure above and below it.

According to the preferred embodiment of the present invention, interlocking hinges become an integral piece of the printed circuit board. These hinges then mate to form one contiguous structure. The one-piece hinges minimize fabrication and assembly costs since they can be plastic molded and do not require additional hardware.

The interlocking feature is provided by a projection and an opening on each hinge. In one position the projection on one hinge fits freely into the opening of a second hinge. In this position, it is easy to add additional boards to the stack or remove a particular board from the stack. But, when the hinges are rotated to the in-line position, a cam on the projection forms an interference fit with the opening and provides a rigid structure. Flexible cable is used to electrically couple the printed circuit boards.

DESCRIPTION OF THE DRAWINGS

FIG. 1 is a side view of the interlocking hinge of the preferred embodiment.

FIG. 2 is a sectional view of the interlocking hinge of the preferred embodiment.

FIG. 3 is a side view of the interlocking hinge of the preferred embodiment.

FIG. 4 is a back view of the interlocking hinge of the preferred embodiment.

FIG. 5 is a bottom view of the interlocking hinge of the preferred embodiment.

DESCRIPTION OF THE PREFERRED EMBODIMENT

Figure 6:
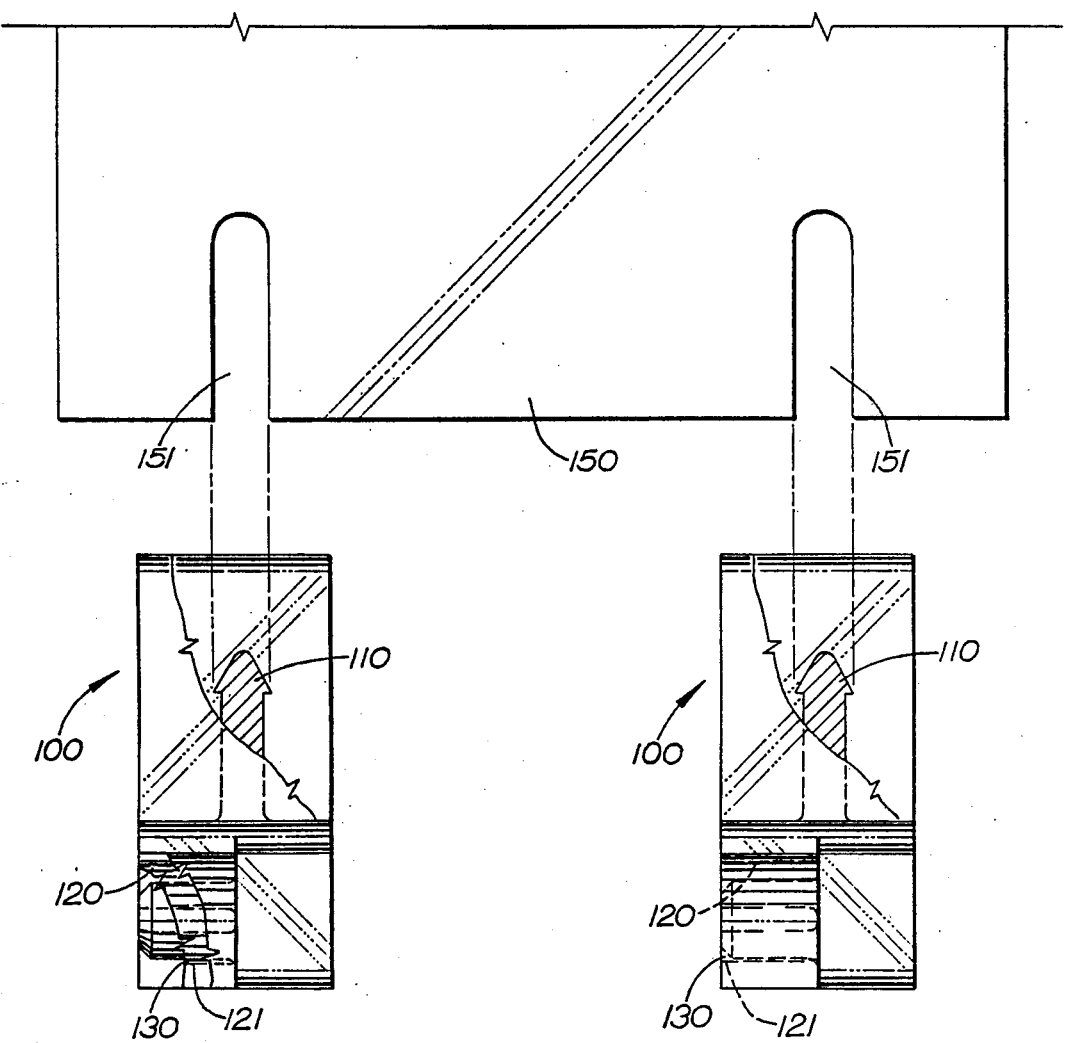
FIG. 6 shows a top view of a printed circuit board and two hinges for attaching thereon in accordance with the preferred embodiment.

In FIGS. 1, 2, 3, 4, and 5 various views of an interlocking hinge 100 which is used in the preferred embodiment are shown. The interlocking hinge 100 is designed to mate with other interlocking hinges to form a support structure for a plurality of printed circuit boards. The hinges are joined by inserting a projection 120 of a first hinge into an opening 130 of a second hinge. The two hinges selected are most easily joined when the lobe-shaped portion 121 of projection 120 is aligned with a larger radius portion 131 of opening 130. Once the two selected hinges are fitted together, one of the hinges is rotated about the axis defined by the mated projection and opening. The lobe-shaped portion 121 of the projection is forced into the smaller radius portion of the opening 130. An interference fit which results from this rotation causes the two hinges to form a rigid structure.

In FIG. 6 there is shown the manner in which the interlocking hinges are attached to printed circuit boards. For stability, two hinges are usually attached to each printed circuit board. The attachment is effected by force-fitting an arrow-shaped portion 110 of hinge 120 into a slot 151 in printed circuit board 150. Once hinges 100 are attached to printed circuit board 150 they remain an integral part of that assembly. When a board is removed from the stack of printed circuit boards to be replaced by another board, the replacement board should have its own set of hinges attached.

Figure 9:
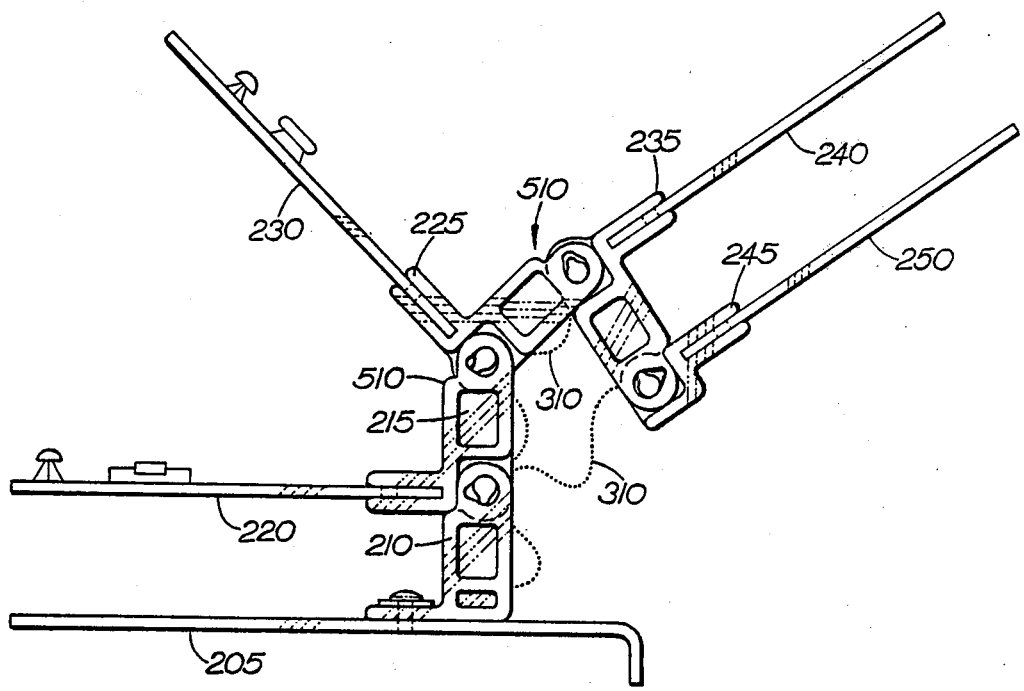
FIG. 9 shows a side view of a stack of printed circuit boards in accordance with the preferred embodiment.

In FIG. 9, a base-hinge 210 is shown. Base-hinge 210 is affixed to deck 205 and provides a base for hinges 215, 225, 235 and 245 which are attached to the printed circuit boards. Hinge 245 is also a modified hinge; additional boards cannot be mounted above it. Hinge 245 is attached to the top printed circuit board of the stack to reduce the total height of the stack. Note that a stop 510 is provided on each of the interlocking hinges to ease alignment of the hinges and ensure all boards are parallel when the hinges are rotated to the locked position.

In FIG. 9, a stack of printed circuit boards has been adjusted to provide access to components on boards 220 and 230. By using a flexible cable 310 to couple printed circuit boards 220, 230, 240, and 250, the stack may be rotated to provide access to components on any of the printed circuit boards without disturbing their operational state. Once a defective component has been isolated, the board containing it may be removed for repair or replacement.

Figure 7:
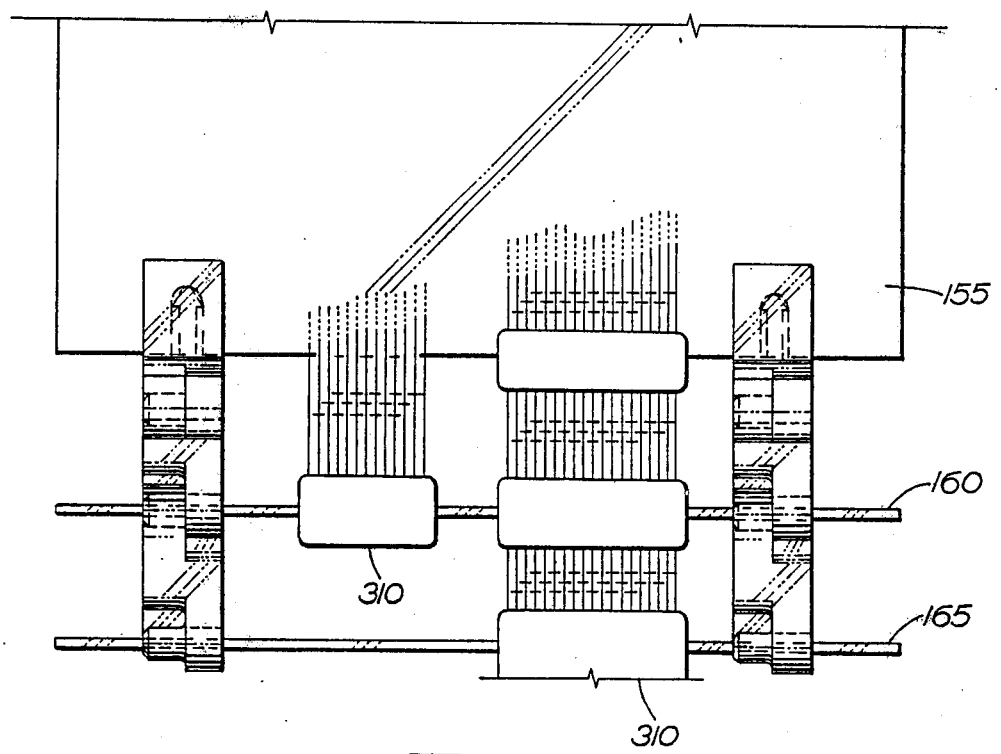
FIG. 7 shows a rear view of a stack of printed circuit boards coupled in accordance with the preferred embodiment.
Figure 8:
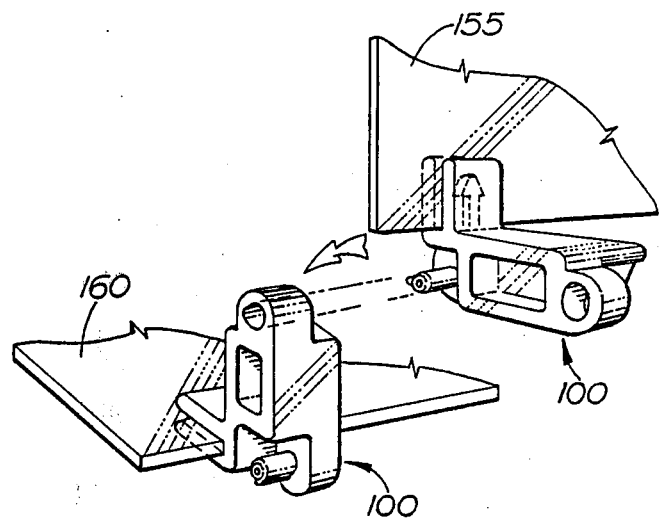
FIG. 8 is a perspective view of two hinges in the relative position for engagement and disengagement.

The procedure to remove a selected printed circuit board from the stack is illustrated in FIGS. 7 and 8. In the preferred embodiment, flexible cable 310 couples printed circuit boards 155, 160, and 165. After cable 310 is removed, the printed circuit board selected for removal from the stack is rotated to a relative position with respect to the adjacent board which aligns the projection and the opening in the hinges coupling the two boards. The board is then moved sidewards to disengage the projection and opening. A replacement board is installed by aligning the hinge of the replacement board with the hinge of the adjacent board, mating the cam on the projection of the one hinge with the opening of the other hinge, as shown in FIG. 8, and rotating the replacement board so that the above-explained interference fit occurs and locks the two boards together. Any cabling removed may then be replaced.

Additional features may be included to provide a greater degree of freedom from shock and vibration. For example, various features may include stand-offs or spacers to provide additional support and provide a more rigid structure. The choice of these various additional support systems is not part of the present invention.

We claim:

1. An interlocking hinge comprising:
   a body;
   a projection extending perpendicular to the longitudinal axis and adjacent to a first longitudinal end of said body, said projection having one or more eccentric portions with respect to the central axis thereof;
   engaging means adjacent to a second longitudinal end of said body for freely engaging an object of a shape corresponding to that of said projection in one relative position and for locking together therewith in a second relative position; and
   attachment means connected to the body of said hinge for attaching an external member thereto, said attachment means comprising two lateral extensions from said body, said lateral extensions having force-fitting means interposed therebetween for force-fitting into an opening in said external member.

2. The interlocking hinge as in claim 1, wherein the external member is a printed circuit board and the two lateral extensions are essentially planar structures and the force-fitting means comprises an arrowhead shaped structure for force-fitting into a slot in said printed circuit board.

3. The interlocking hinge as in claim 2, wherein said projection comprises a pin having a lobe-shaped portion and said engaging means comprises a cavity defined by said body and having internal dimensions slightly larger than the external dimensions of said pin, whereby said pin fits freely within said cavity in one relative position and locks together therewith because of an interference fit in a second relative position.

4. A system for supporting a plurality of printed circuit boards, the system comprising:
   a plurality of printed circuit boards; and
   a plurality of interlocking hinges, as in claim 3, attached to said plurality of printed circuit boards, said interlocking hinges being coupled together in at least one group, said hinges in each group being arranged in linear fashion and interlocking through the mating of successive projections and engaging means.

5. The system of claim 4 further comprising:
   a support structure; and
   a base hinge affixed to the support structure and interlocking with the plurality of interlocking hinges.

6. The system of claim 5 further comprising a flexible cable coupled to the printed circuit boards for providing electrical pathways therebetween.

* * * * *